United States Patent
Lin et al.

(10) Patent No.: US 10,025,660 B2
(45) Date of Patent: Jul. 17, 2018

(54) DATA READING METHOD, MEMORY CONTROL CIRCUIT UNIT AND MEMORY STORAGE APPARATUS

(71) Applicant: PHISON ELECTRONICS CORP., Miaoli (TW)

(72) Inventors: Wei Lin, Taipei (TW); Tien-Ching Wang, Kaohsiung (TW); Kuo-Hsin Lai, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 8 days.

(21) Appl. No.: 15/009,771

(22) Filed: Jan. 28, 2016

(65) Prior Publication Data
US 2017/0168893 A1  Jun. 15, 2017

(30) Foreign Application Priority Data
Dec. 14, 2015 (TW) .............................. 104141895 A

(51) Int. Cl.
G06F 11/00 (2006.01)
G06F 11/10 (2006.01)
G11C 29/52 (2006.01)

(52) U.S. Cl.
CPC .......... *G06F 11/1068* (2013.01); *G11C 29/52* (2013.01)

(58) Field of Classification Search
CPC ........................... G06F 11/1068; G11C 29/52
See application file for complete search history.

(56) References Cited

U.S. PATENT DOCUMENTS

| | | | |
|---|---|---|---|
| 2009/0013233 A1* | 1/2009 | Radke | G06F 11/1072 714/752 |
| 2010/0241926 A1* | 9/2010 | Wang | H04L 1/005 714/758 |
| 2014/0164878 A1* | 6/2014 | Tam | G06F 11/1012 714/773 |

\* cited by examiner

*Primary Examiner* — Thien Nguyen
(74) *Attorney, Agent, or Firm* — JCIPRNET

(57) ABSTRACT

A data reading method for a rewritable non-volatile memory module is provided. The method includes performing an error correction decoding operation on an user data stream according to an error checking and correcting (ECC) code to generate a first decoded data stream; searching uncorrectable sub-data units from decoded sub-data units of the first decoded data stream; selecting a target sub-data unit from the uncorrectable sub-data units; adjusting the target sub-data unit in the first decoded data stream to generate an adjusted user data stream; and re-performing the error correction decoding operation on the adjusted user data stream to generate a second decoded data stream; if the second decoded data stream has no error bit, transmitting the second decoded data stream as a corrected data stream to a host system.

18 Claims, 9 Drawing Sheets

US 10,025,660 B2

DATA READING METHOD, MEMORY CONTROL CIRCUIT UNIT AND MEMORY STORAGE APPARATUS

CROSS-REFERENCE TO RELATED APPLICATION

This application claims the priority benefit of Taiwan application serial no. 104141895, filed on Dec. 14, 2015. The entirety of the above-mentioned patent application is hereby incorporated by reference herein and made a part of this specification.

BACKGROUND

1. Technology Field

The present invention relates to a data reading method for a rewritable non-volatile memory module, a memory control circuit unit using the method, and a memory storage apparatus using the method.

2. Description of Related Art

Digital cameras, mobile phones, and MP3 music players have undergone rapid growth in recent years, so that consumers' demands for storage media have also drastically increased. Since a rewritable non-volatile memory module (e.g., a flash memory) is characterized by data non-volatility, low power consumption, small volume, the non-mechanical structure, and so on, the rewritable non-volatile memory module is suitable for being installed in a variety of portable multimedia apparatuses.

Generally, data written into the rewritable non-volatile memory module are encoded according to an error correcting code, and the data read from the rewritable non-volatile memory module are also decoded by performing the corresponding process. The error correcting ability of the error correcting code is somehow limited. For instance, in a case where the error correcting code is generated by using a block turbo code (BTC) algorithm or a low density parity check (LDPC) code algorithm in an iterative manner, if the number of times of performing the iterative decoding operations is increased to a certain degree, the number of error bits will no longer be reduced together with the number of times of the subsequently performed iterative decoding operations. This is the so-called error floor. Accordingly, how to decode data read from the rewritable non-volatile memory module to acquire correct data is one of the major concerns in the pertinent industry.

SUMMARY

The present invention is directed to a data reading method, a memory control circuit unit, and a memory storage apparatus for effectively correcting the read data.

In an exemplary embodiment, a data reading method for a rewritable non-volatile memory module is provided. The method includes reading data from the rewritable non-volatile memory module. Here, the data include a user data stream and an error checking and correcting (ECC) code set, the user data stream includes a plurality of sub-data units, the ECC code set includes a plurality of column error correcting codes and a plurality of row error correcting codes, the column error correcting codes respectively correspond to a plurality of column data segments in the sub-data units, the row error correcting codes respectively corresponding to a plurality of row data segments in the sub-data units, the column data segments are arranged in a matrix form, and the row data segments are arranged in a matrix form. The method also includes performing an error correction decoding operation on the user data stream according to the ECC code set to generate a first decoded data stream. Here, the first decoded data stream includes a plurality of decoded sub-data units corresponding to at least a part of the sub-data units. The method also includes searching at least one uncorrectable sub-data unit from the decoded sub-data units, selecting at least one target sub-data unit from the at least one uncorrectable sub-data unit, adjusting the at least one target sub-data unit in the first decoded data stream to generate an adjusted user data stream, and re-performing the error correction decoding operation on the adjusted user data stream to generate a second decoded data stream. The method further includes transmitting the second decoded data stream as a corrected data stream to a host system.

In an exemplary embodiment, a memory control circuit unit configured to control a rewritable non-volatile memory module is provided. The memory control circuit unit includes a host interface, a memory interface, a memory management circuit, and an error checking and correcting (ECC) circuit. The host interface is configured to couple to a host system. The memory interface is configured to couple to the rewritable non-volatile memory module. The memory management circuit is coupled to the host interface and the memory interface. The ECC circuit is coupled to the memory management circuit. The memory management circuit sends a read command sequence to read data from the rewritable non-volatile memory module. The read data include a user data stream and an ECC code set, the user data stream includes a plurality of sub-data units, and the ECC code set includes a plurality of column error correcting codes and a plurality of row error correcting codes. The column error correcting codes respectively correspond to a plurality of column data segments in the sub-data units arranged in a matrix form, and the row error correcting codes respectively corresponding to a plurality of row data segments in the sub-data units arranged in a matrix form. The ECC circuit performs an error correction decoding operation on the user data stream according to the ECC code set to generate a first decoded data stream, and the first decoded data stream includes a plurality of decoded sub-data units corresponding to at least a part of the sub-data units. The ECC circuit searches at least one uncorrectable sub-data unit from the decoded sub-data units, selects at least one target sub-data unit from the at least one uncorrectable sub-data unit, adjusts the at least one target sub-data unit in the first decoded data stream to generate an adjusted user data stream, and re-performs the error correction decoding operation on the adjusted user data stream to generate a second decoded data stream. If the second decoded data stream contains no error bit, the memory management circuit transmits the second decoded data stream as a corrected data stream to the host system.

In an exemplary embodiment, a memory storage apparatus that includes a connection interface unit, a rewritable non-volatile memory module, and a memory control circuit unit is provided. The connection interface unit is configured to couple to a host. The memory control circuit unit is coupled to the connection interface unit and the rewritable non-volatile memory module. The memory control circuit unit sends a read command sequence to read data from the rewritable non-volatile memory module. The data include a user data stream and an ECC code set, the user data stream includes a plurality of sub-data units, and the ECC code set includes a plurality of column error correcting codes and a plurality of row error correcting codes. The column error correcting codes respectively correspond to a plurality of column data segments in the sub-data units arranged in a matrix form, and the row error correcting codes respectively corresponding to a plurality of row data segments in the sub-data units arranged in a matrix form. The memory control circuit unit performs an error correction decoding operation on the user data stream according to the ECC code set to generate a first decoded data stream, and the first decoded data stream includes a plurality of decoded sub-data units corresponding to at least a part of the sub-data units. Besides, the memory control circuit unit searches at least one uncorrectable sub-data unit from the decoded sub-data units, selects at least one target sub-data unit from the at least one uncorrectable sub-data unit, adjusts the at least one target sub-data unit in the first decoded data stream to generate an adjusted user data stream, and re-performs the error correction decoding operation on the adjusted user data stream to generate a second decoded data stream. If the second decoded data stream contains no error bit, the memory control circuit unit transmits the second decoded data stream as a corrected data stream to a host system.

In view of the above, during the data decoding process, according to the data reading method, the memory control circuit unit, and the memory storage apparatus provided herein the data that are not successfully decoded can be decoded by performing a bit flipping process on the sub-data unit having the error bits of data. Thereby, the accuracy of reading data and the capability for protecting the stored data can be enhanced.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the present invention, and are incorporated in and constitute a part of this specification. The drawings illustrate embodiments of the present invention and, together with the description, serve to explain the principles of the present invention.

DESCRIPTION OF EMBODIMENTS

Figure 1:
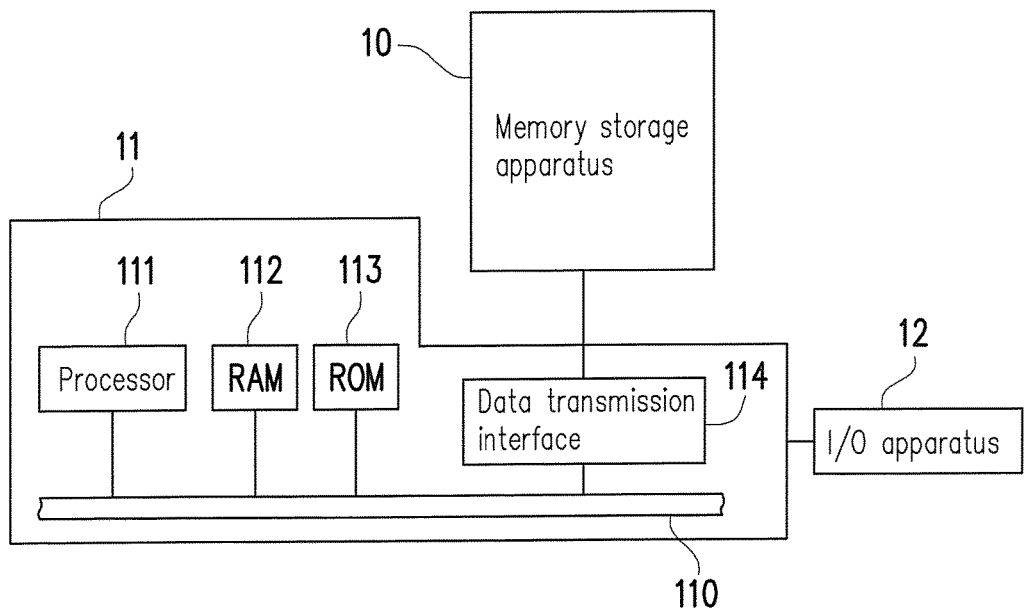
FIG. 1 is a schematic diagram illustrating a host system, a memory storage apparatus, and an input/output (I/O) apparatus according to an exemplary embodiment.

Reference will now be made in detail to the exemplary embodiments of the invention, examples of which are illustrated in the accompanying drawings. Wherever possible, the same reference numbers are used in the drawings and the description to refer to the same or like parts.

Embodiments of the invention may comprise any one or more of the novel features described herein, including in the detailed description, and/or shown in the drawings. As used herein, "at least one," "one or more," and "and/or" are open-ended expressions that are both conjunctive and disjunctive in operation. For instance, each of the expressions "at least on of A,B and C," "at least one of A, B, or C," "one or more of A, B, and C," "one or more of A, B, or C," and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more," and "at least one" can be used interchangeably herein.

A memory storage apparatus (also referred to as a memory storage system) typically includes a rewritable non-volatile memory module and a controller (also referred to as a control circuit unit). The memory storage apparatus is usually used together with a host system, such that the host system is able to write data into or read data from the memory storage apparatus.

Figure 2:
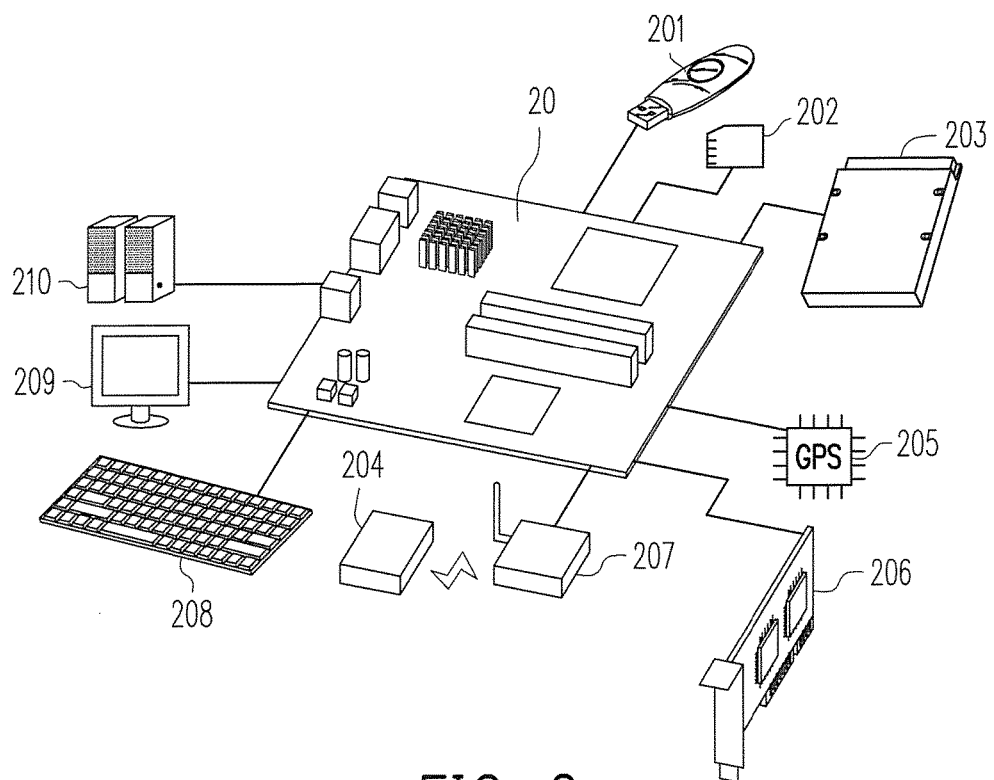
FIG. 2 is a schematic diagram illustrating a host system, a memory storage apparatus, and an I/O apparatus according to another exemplary embodiment.

FIG. 1 is a schematic diagram illustrating a host system, a memory storage apparatus, and an input/output (I/O) apparatus according to an exemplary embodiment. FIG. 2 is a schematic diagram illustrating a host system, a memory storage apparatus, and an I/O apparatus according to another exemplary embodiment.

With reference to FIG. 1 and FIG. 2, the host system 11 generally includes a processor 111, a random access memory (RAM) 112, a read only memory (ROM) 113, and a data transmission interface 114. The processor 111, the RAM 112, the ROM 113, and the data transmission interface 114 are coupled to a system bus 110.

In an exemplary embodiment, the host system 11 is coupled to the memory storage apparatus 10 through the data transmission interface 114. For instance, the host system 11 writes data into the memory storage apparatus 10 or read data from the memory storage apparatus 10 through the data transmission interface 114. The host system 11 is coupled to the I/O apparatus 12 through the system bus 110. For instance, the host system 11 transmits an output signal to the I/O apparatus 12 or receives an output signal from the I/O apparatus 12 through the system bus 110.

In the present exemplary embodiment, the processor 111, the RAM 112, the ROM 113, and the data transmission interface 114 are configured on a motherboard 20 of the host system 11. The number of the data transmission interface 114 may be one or plural. The motherboard 20 is coupled to the memory storage apparatus 10 in a wireless manner or via a cable through the data transmission interface 114. The memory storage apparatus 10 is, for instance, a flash drive 201, a memory card 202, a solid state drive (SSD) 203 or a wireless memory storage apparatus 204. The wireless memory storage apparatus 204 may be a memory storage apparatus employing various wireless communication techniques, such as a near field communication (NFC) memory storage apparatus, a wireless fidelity (Wi-Fi) memory storage apparatus, a Bluetooth memory storage apparatus, a Bluetooth memory storage apparatus (e.g., an iBeacon) with low power consumption, and so on. The motherboard 20 may also be coupled to a variety of I/O apparatuses, such as a global positioning system (GPS) module 205, a network interface card 206, a wireless transmission apparatus 207, a keyboard 208, a screen 209, and a speaker 210 through the system bus 110. For instance, in an exemplary embodiment, the motherboard 20 may access the wireless memory storage apparatus 204 through the wireless transmission apparatus 207.

Figure 3:
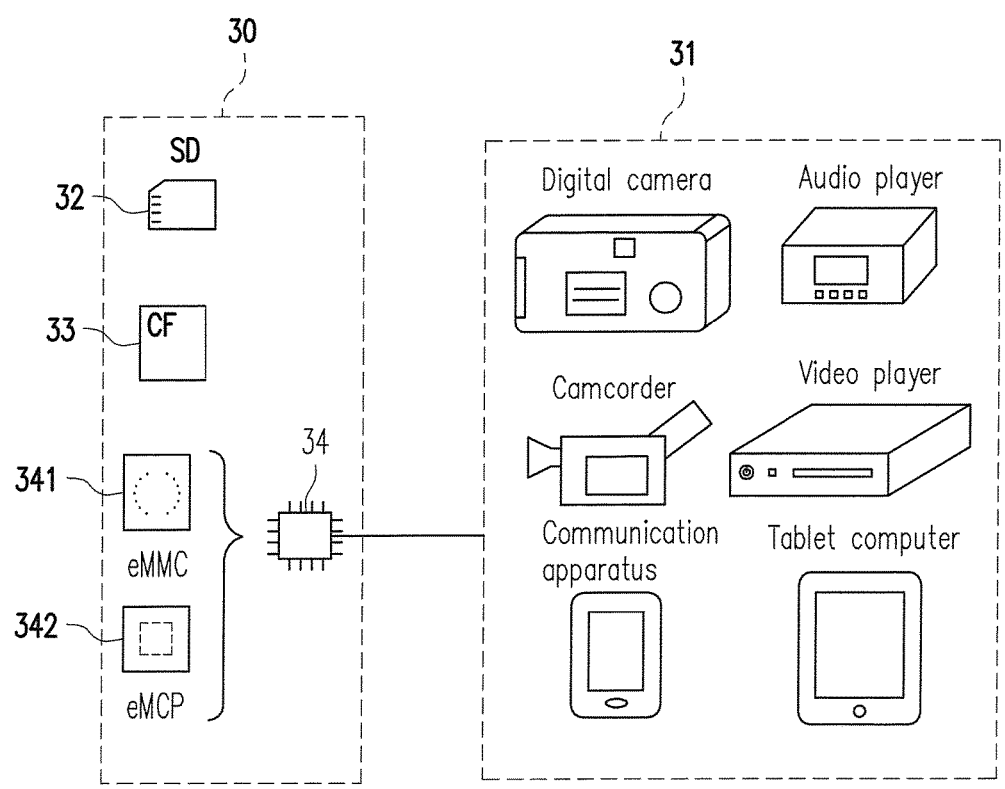
FIG. 3 is a schematic diagram illustrating a host system and a memory storage apparatus according to an exemplary embodiment.

In an exemplary embodiment, the aforementioned host system may be any system substantially used together with the memory storage apparatus for storing data. In the previous embodiment, the host system is a computer system. By contrast, FIG. 3 is a schematic diagram illustrating a host system and a memory storage apparatus according to another exemplary embodiment the invention. With reference to FIG. 3, in another exemplary embodiment, a host system 31 may also be a digital camera, a camcorder, a communication apparatus, an audio player, a video player, a tablet computer, and so on, while a memory storage apparatus 30 used by the host system 31 may be a non-volatile memory apparatus, such as an secure digital (SD) card 32, a compact flash (CF) card 33, and an embedded storage apparatus 34. The embedded storage apparatus 34 includes an embedded multimedia card (eMMC) 341 and/or an embedded multi-chip package (eMCP) storage apparatus 342, wherein a memory module is directly coupled to a substrate of the host system.

Figure 4:
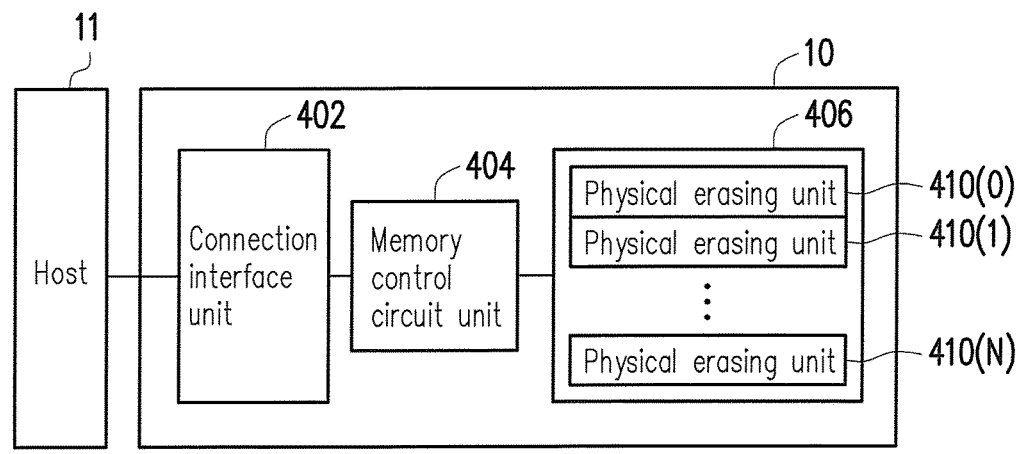
FIG. 4 a simple block diagram illustrating a host system and a memory storage apparatus according to an exemplary embodiment.

FIG. 4 a simple block diagram illustrating a host system and a memory storage apparatus according to an exemplary embodiment.

With reference to FIG. 4, the memory storage apparatus 10 includes a connection interface unit 402, a memory control circuit unit 404, and a rewritable non-volatile memory module 406.

In the present exemplary embodiment, the connection interface unit 402 complies with the serial advanced technology attachment (SATA) standard. However, it should be understood that the present invention is not limited thereto, and the connection interface unit 402 may also comply with the parallel advanced technology attachment (PATA) standard, the Institute of Electrical and Electronic Engineers (IEEE) 1394 standard, the peripheral component interconnect (PCI) express standard, the universal serial bus (USB) standard, the ultra high speed-I (UHS-I) interface standard, the ultra high speed-II (UHS-II) interface standard, the secure digital (SD) standard, the memory sick (MS) interface standard, the multi-chip package interface standard, the multi media card (MMC) interface standard, the eMMC interface standard, the universal flash storage (UFS) interface standard, the embedded multi chip package (eMCP) interface standard, the compact flash (CF) standard, the integrated device electronics (IDE) standard, or other suitable standards. According to the present exemplary embodiment, the connection interface unit 402 and the memory control circuit unit 404 may be packaged into one chip, or the connection interface unit 402 may be arranged outside a chip having the memory control circuit unit 404.

The memory control circuit unit 404 is configured to execute a plurality of logic gates or control instructions implemented in a hardware form or a firmware form and perform various data operations (e.g., data writing, reading, and erasing) in the rewritable non-volatile memory module 406 according to commands issued by the host system 11.

The rewritable non-volatile memory module 406 is coupled to the memory control circuit unit 404 and configured for storing data written by the host system 11. The rewritable non-volatile memory module 406 has a plurality of physical erasing units 410(0) to 410(N). For instance, the physical erasing units 410(0) to 410(N) may belong to the same memory die or belong to different memory dies. Each physical erasing unit has a plurality of physical programming units, and the physical programming units belonging to the same physical erasing unit may be written independently and erased simultaneously. However, the present invention is not limited thereto, and each of the physical erasing units may also be comprised of 64, 256, or any other number of physical programming units.

More specifically, the physical erasing unit is the smallest unit for erasing data; namely, each of the physical erasing units contains the least number of memory cells that are erased all together. The physical programming unit is the smallest unit for programming data; that is, each of the physical programming units is the smallest unit for writing data. Each physical programming unit usually includes a data bit area and a redundant bit area. The data bit area includes a plurality of physical access addresses for storing data of users, and the redundant bit area is configured for storing system data (e.g., control information and error correcting codes). In the present exemplary embodiment, each data bit area of the physical programming unit contains 8 physical access addresses, and the size of each physical access address is 512 bytes. However, in other exemplary embodiments, more or less number of the physical access addresses may be contained in the data bit area, and the amount and the size of the physical access addresses are not limited in the present invention. For instance, in an exemplary embodiment, the physical erasing units are physical blocks, and the physical programming units are physical pages or a physical sectors, which should however not be construed as limitations to the present invention.

In the present exemplary embodiment, the rewritable non-volatile memory module 406 is a multi-level cell (MLC) NAND flash memory module (i.e., a flash memory module capable of storing data of 2 bits in one memory cell). However, the present invention is not limited thereto, and the rewritable non-volatile memory module 406 may also be a single-level cell (SLC) NAND flash memory module (i.e., a flash memory module capable of storing data of 1 bit in one memory cell), a trinary-level cell (TLC) NAND flash memory module (i.e., a flash memory module capable of storing data of 3 bits in one memory cell), other flash memory modules, or other memory modules having the same characteristics.

Figure 5:
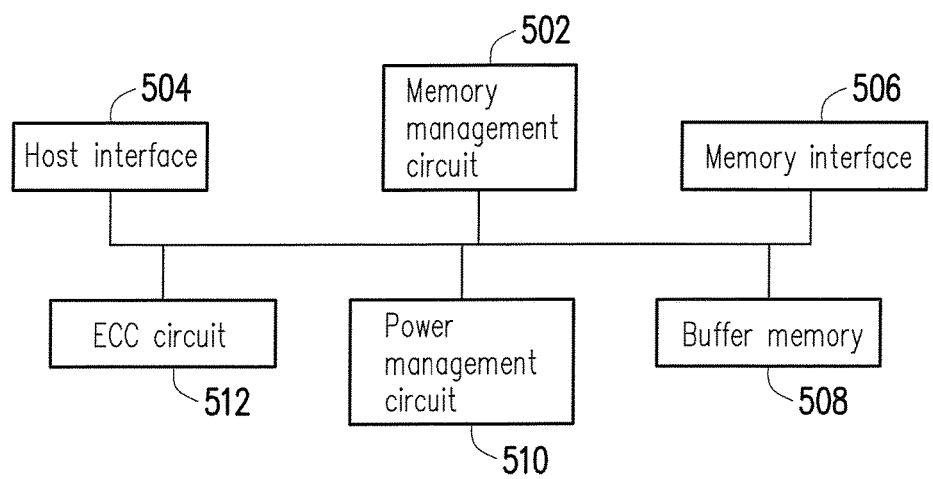
FIG. 5 is a simple block diagram illustrating a memory control circuit unit according to an exemplary embodiment.

FIG. 5 is a simple block diagram illustrating a memory control circuit unit according to an exemplary embodiment.

With reference to FIG. 5, the memory control circuit unit 404 includes a memory management circuit 502, a host interface 504, a memory interface 506, a buffer memory 508, a power management circuit 510, and an error checking and correcting (ECC) circuit 512.

The memory management circuit 502 is configured to control the overall operation of the memory control circuit unit 404. Particularly, the memory management circuit 502 has a plurality of control instructions; when the memory storage apparatus 10 is in operation, the control instructions are executed to perform data writing, reading, and erasing operations.

In the present exemplary embodiment, the control instructions of the memory management circuit 502 are implemented in a firmware form. For instance, the memory management circuit 502 has a microprocessor unit (not shown) and a read-only memory (ROM, not shown), and the control instructions are burnt into the ROM. When the memory storage apparatus 10 is in operation, the control instructions are executed by the microprocessor unit to write, read, and erase data.

Figure 6:
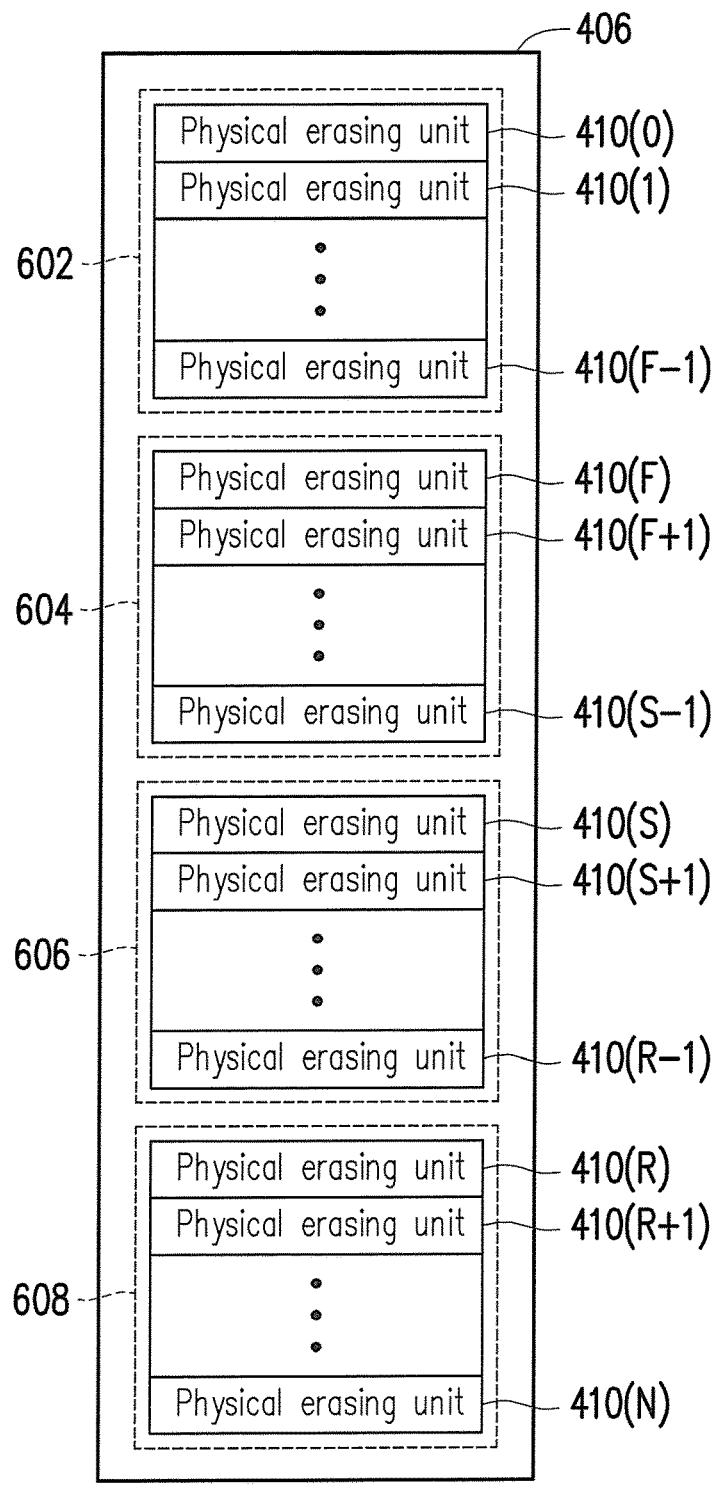
FIG. 6 and FIG. 7 are schematic diagrams illustrating an example of managing physical erasing units according to an exemplary embodiment.
Figure 7:
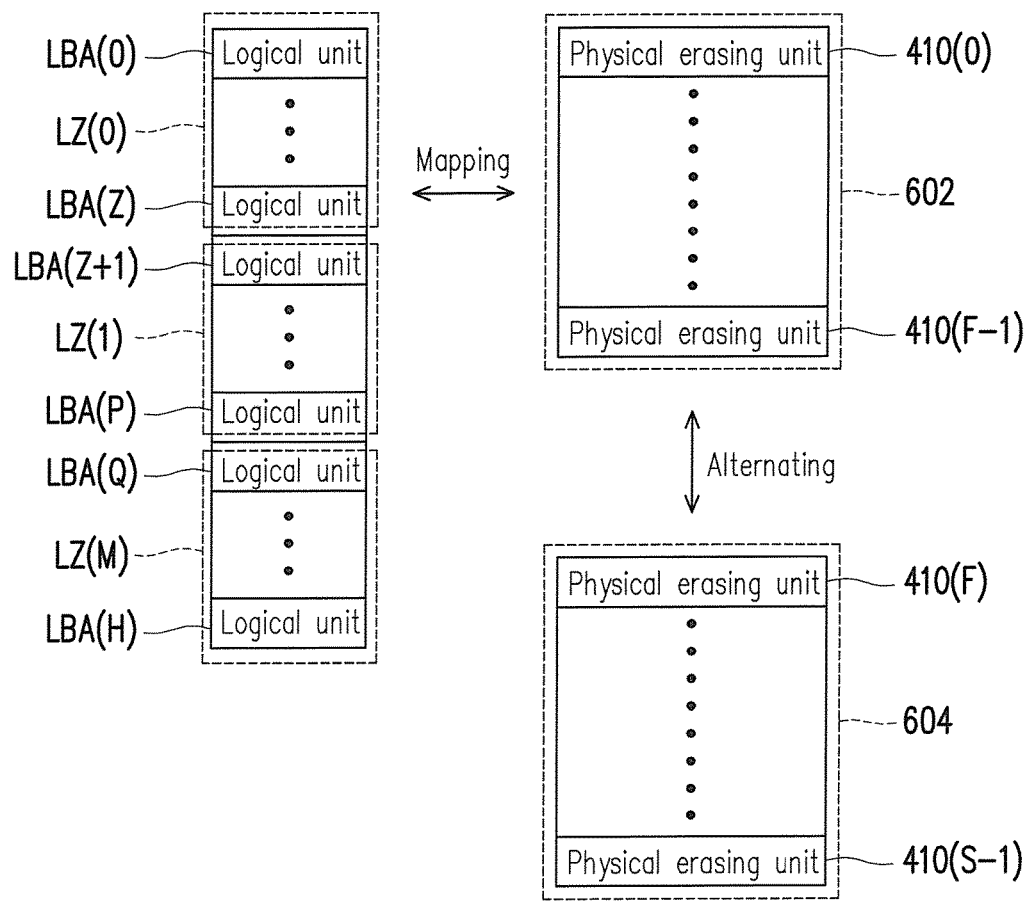

FIG. 6 and FIG. 7 are schematic diagrams illustrating an example of managing physical erasing units according to an exemplary embodiment of the invention.

It should be understood that the terms used herein for describing the operations (such as "get", "select," "group," "divide," and "associate") performed on the physical erasing units of the rewritable non-volatile memory module 106 refer to logical operations performed on these physical erasing units. Namely, the physical erasing units in the rewritable non-volatile memory module are only logically operated, and the actual positions of the physical erasing units in the rewritable non-volatile memory module are not changed.

With reference to FIG. 6, the memory control circuit unit 404 (or the memory management circuit 502) logically groups the physical erasing units 410(0) to 410(N) into a data area 602, a spare area 604, a system area 606, and a replacement area 608.

The physical erasing units logically belonging to the data area 602 and the spare area 604 are configured for storing data from the host system 11. Particularly, the physical erasing units belonging to the data area 602 are already configured for storing data, and the physical erasing units belonging to the spare area 604 are configured for replacing the physical erasing units belonging to the data area 602. That is, when the writing commands and the data to be written are received from the host system 11, the memory management circuit 502 gets physical erasing units from the spare area 604 and writes the data into the gotten physical erasing units for replacing the physical erasing units belonging to the data area 602.

The physical erasing units logically belonging to the system area 606 are used for recording system data. For instance, the system data include the manufacturers and models of the rewritable non-volatile memory module, the number of the physical erasing units in the rewritable non-volatile memory module, the number of the physical programming units in each physical erasing unit, and so on.

The physical erasing units logically belonging to the replacement area 608 are physical erasing units that are applied in a defective physical erasing unit replacement procedure to replace damaged and defective physical erasing units. Particularly, if there are still normal physical erasing units in the replacement area 608, and the physical erasing unit in the data area 602 is damaged, the memory management circuit 502 selects a normal physical erasing unit from the replacement area 608 to replace the damaged physical erasing unit.

Note that the number of physical erasing units respectively belonging to the data area 602, the spare area 604, the system area 606, and the replacement area 608 may vary according to different memory specifications. Additionally, it has to be understood that the grouping relation of associating the physical erasing units with the data area 602, the spare area 604, the system area 606, and the replacement area 608 is dynamically changed during the operation of the memory storage apparatus 10. For instance, when a physical erasing unit belonging to the spare area 604 is damaged and replaced by a physical erasing unit belonging to the replacement area 608, the physical erasing unit originally belonging to the replacement area 608 is associated with the spare area 604.

As indicated in FIG. 7, the memory control circuit unit 404 (or the memory management circuit 502) has logical addresses LBA(0) to LBA(H) to be mapped to the physical erasing units belonging to the data area 602. Each of the logical addresses has a plurality of logical units to be mapped to the physical programming units corresponding to the physical erasing units. Besides, if the host system 11 intends to write data into the logical addresses or update data stored in the logical addresses, the memory control circuit unit 404 (or the memory management circuit 502) selects one physical erasing unit from the spare area 604 to alternate with one physical erasing unit in the data area 602. In the present exemplary embodiment, the logical units may be logical pages or logical factors.

In order to identify the actual physical erasing unit where data of each logical address are stored, the memory control circuit unit 404 (or the memory management circuit 502) records mapping relations between the logical address and the physical erasing unit according to the present exemplary embodiment. When the host system 11 accesses data in the logical unit, the memory control circuit unit 404 (or the memory management circuit 502) confirms the logical address where such logical unit belongs and accesses data from the physical erasing unit mapped to such logical address. For instance, in the present exemplary embodiment, the memory control circuit unit 404 (or the memory management circuit 502) stores a logical-to-physical address mapping table in the rewritable non-volatile memory module 406 for recording the physical erasing units respectively mapped to each logical address. When accessing data, the memory control circuit unit 404 (or the memory management circuit 502) loads the logical-to-physical address mapping table to the buffer memory 508 for data maintenance.

It should be mentioned that the buffer memory 508 may not be able to store the mapping tables recording the mapping relations of all logical addresses due to its limited capacity. Therefore, in the present exemplary embodiment, the memory control circuit unit 404 (or the memory management circuit 502) groups the logical addresses LBA(0) to LBA(H) into a plurality of logical zones LZ(0) to LZ(M) and assigns one logical-to-physical address mapping table to each logical zone. Particularly, when the memory control circuit unit 404 (or the memory management circuit 502) updates the mapping relation of one of the logical addresses, the logical-to-physical address mapping table corresponding to the logical zone of the logical address is loaded to the buffer memory 508 and is then updated.

In another exemplary embodiment, the control instructions of the memory management circuit 502 are stored in a specific area (for instance, the system area of the memory module exclusively used for storing system data) of the rewritable non-volatile memory module 406 as program codes. Additionally, the memory management circuit 502 may have a micro-processor unit (not shown), a ROM (not shown), and a RAM (not shown). In particular, the ROM has boot codes, and when the memory control circuit unit 404 is enabled, the microprocessor unit first executes the boot codes to load the control instructions from the rewritable non-volatile memory module 406 into the RAM of the memory management circuit 502. The microprocessor unit then runs the control instructions to write, read, and erase data.

Moreover, the control instructions of the memory management circuit 502 may also be implemented in a hardware form according to another exemplary embodiment of the invention. For instance, the memory management circuit 502 includes a microcontroller, a memory cell management circuit, a memory writing circuit, a memory reading circuit, a memory erasing circuit, and a data processing circuit. The memory cell management circuit, the memory writing circuit, the memory reading circuit, the memory erasing circuit, and the data processing circuit are coupled to the microcontroller. The memory cell management circuit is configured to manage physical erasing units of the rewritable non-volatile memory module 406. The memory writing circuit is configured to issue a write command to the rewritable non-volatile memory module 406 for writing data thereto. The memory reading circuit is configured to issue a read command to the rewritable non-volatile memory module 406 for reading data therefrom. The memory erasing circuit is configured to issue an erase command to the rewritable non-volatile memory module 406 for erasing data therefrom. The data processing circuit is configured to process data to be written to the rewritable non-volatile memory module 406 or data read from the rewritable non-volatile memory module 406.

With reference to FIG. 5, the host interface 504 is coupled to the memory management circuit 502 and is configured to couple to the connection interface unit 402, so as to receive and identify commands and data transmitted by the host system 11. Namely, the commands and data are transmitted from the host system 11 to the memory management circuit 502 through the host interface 504. In the present exemplary embodiment, the host interface 504 complies with the SATA standard. However, the invention is not limited thereto, and the host interface 504 may also comply with the PATA standard, the IEEE 1394 standard, the PCI express standard, the USB standard, the UHS-I interface standard, the UHS-II interface standard, the SD standard, the MS standard, the MMC standard, the CF standard, the IDE standard, or any other appropriate data transmission standard.

The memory interface 506 is coupled to the memory management circuit 502 and configured to access the rewritable non-volatile memory module 406. Namely, data to be written into the rewritable non-volatile memory module 406 may be converted by the memory interface 506 into a format acceptable to the rewritable non-volatile memory module 406.

The buffer memory 508 is coupled to the memory management circuit 502 and configured to temporarily store data and commands received from the host system 11 or data received from the rewritable non-volatile memory module 406.

The power management circuit 510 is coupled to the memory management circuit 502 and configured to control the power supply of the memory storage apparatus 10.

The ECC circuit 512 is coupled to the memory management circuit 502 and configured to perform an ECC procedure to ensure data accuracy. To be specific, when the memory management circuit 502 receives a write command from the host system 11, the error checking and correcting circuit 512 generates an error checking and correcting (ECC) code for data corresponding to the write command, and the memory management circuit 502 writes the data and the corresponding ECC code into the rewritable non-volatile memory module 406. Subsequently, when the memory management circuit 502 reads the data from the rewritable non-volatile memory module 406, the memory management circuit 202 simultaneously reads the corresponding ECC code, and the error checking and correcting circuit 512 executes the ECC procedure on the retrieved data based on the corresponding ECC code.

In the present exemplary embodiment, when the memory control circuit unit 404 (or the memory management circuit 502) receives data, the memory control circuit unit 404 (or the memory management circuit 502) divides the data into a plurality of sub-data units, and the ECC circuit 512 performs an error correction encoding operation and generates ECC codes corresponding to the sub-data units, respectively, such that the sub-data units and the ECC codes corresponding the frames are respectively encoded to form ECC code frames. For instance, the length of data (i.e., user data) in each ECC code frame may be 4 kilobytes (KB), 2 KB, 1 KB, etc.

In an exemplary embodiment, the memory control circuit unit 404 (or the memory management circuit 502) decodes data in a unit of the ECC code frame to read the data. For instance, it is assumed that the host system 11 sends a reading command indicating reading read from a logical address to the memory storage apparatus 10 and the to-be-read data are encoded as one ECC code frame. After receiving the reading command, the memory control circuit unit 404 (or the memory management circuit 502) sends a read command sequence to the rewritable non-volatile memory module 406 to read data from the physical programming units mapped to the logical address. A user data stream is obtained from the read data, an error correction decoding operation is performed on the user data stream to generate a corresponding corrected data stream, and the corrected data stream is transmitted back to the host system in response to the reading command. If the to-be-read data are encoded as two or more ECC code frames, the memory control circuit unit 404 (or the memory management circuit 502) reads the data streams corresponding to all of the ECC code frames, performs the error correction decoding operation on the read data streams, combines the data streams as the corrected data streams after successfully correcting the retrieved data streams, and transmits the corrected data streams back to the host system in response to the reading command.

In the present embodiment, the ECC circuit 512 applies a BTC algorithm to perform the error correction encoding/decoding operation. The details of the BTC algorithm are provided hereinafter with reference to the drawings.

Figure 8:
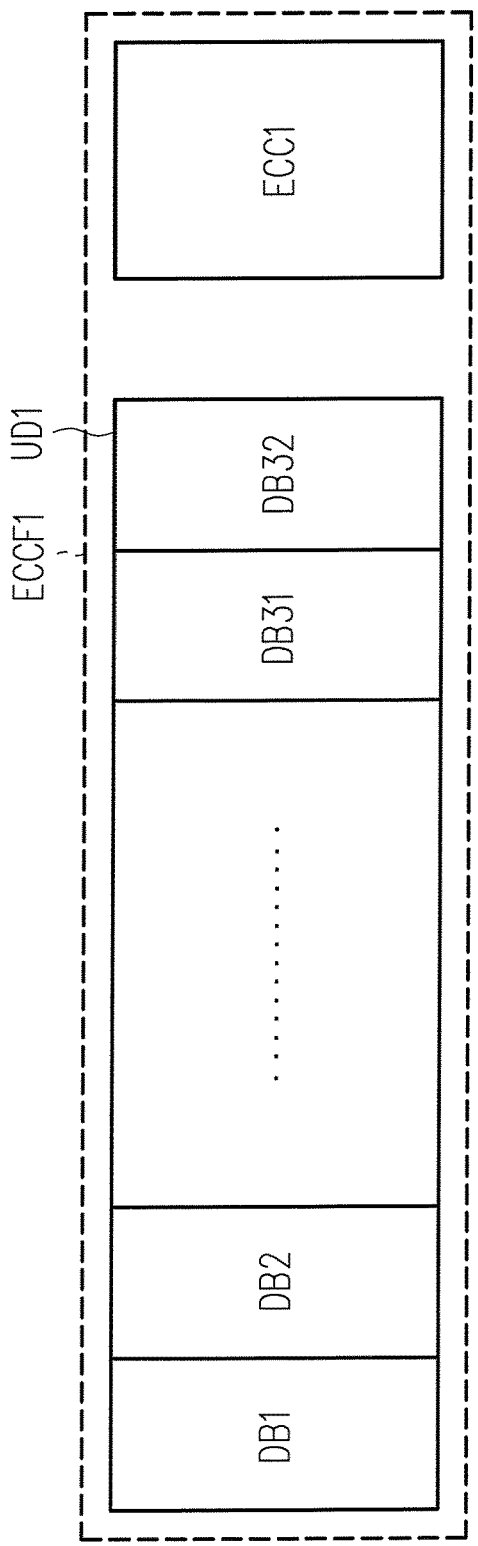
FIG. 8 is a schematic diagram illustrating an ECC code frame according to an exemplary embodiment.
Figure 9:
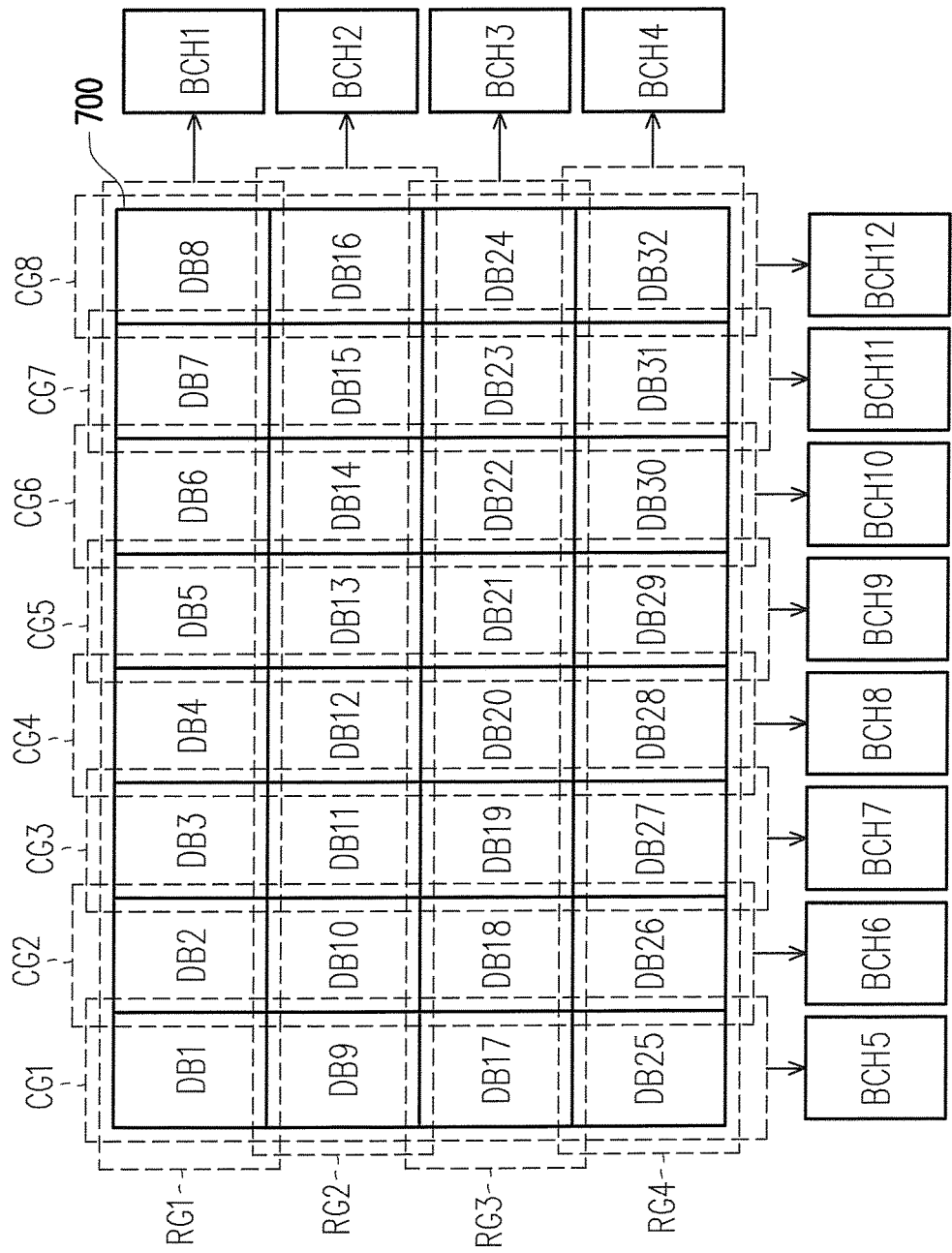
FIG. 9 is a schematic diagram of performing an error correction encoding operation with use of a BTC according to an exemplary embodiment.

FIG. 8 is a schematic diagram illustrating an ECC code frame according to an exemplary embodiment, and FIG. 9 is a schematic diagram of performing an error correction encoding operation with use of a BTC according to an exemplary embodiment. It should be understood that the terms used herein for describing the operations (such as "select," "divide," "associate," and "arrange") performed by the ECC circuit 512 refer to logical operations performed on these physical erasing units. That is, the location where the data processed by the ECC circuit 512 is not changed.

With reference to FIG. 8 and FIG. 9, the ECC circuit 512 performs an error correction encoding operation to generate an error checking and correcting (ECC) code set ECC1. Here, the ECC code set ECC1 and a data stream UD1 together form an error checking and correcting (ECC) code frame ECCF1 that is programmed and written into the physical programming unit of the rewritable non-volatile memory module 406. As provided above, in the present embodiment, the ECC circuit 512 applies a BTC algorithm to perform the error correction encoding/decoding operation on the data stream UD1. While the ECC circuit 512 applies the BTC algorithm to perform the error correction encoding/ decoding operation, the ECC circuit 512 divides the data stream UD1 into a plurality of sub-data units, arranges the sub-data units in a matrix form, generates column error correcting codes and row error correcting codes corresponding to the sub-data units arranged in a matrix form, and combines the generated column error correcting codes and row error correcting codes to generate the ECC code set ECC1.

For instance, the ECC circuit 512 divides the data stream UD1 into sub-data units DB1-DB32. To better elaborate the present invention, note that each sub-data unit contains 2 bytes of data (i.e., 8 bits) in the present exemplary embodiment, which should however not be construed as a limitation to the present invention. In other embodiments, each sub-data unit may contain 1 byte or more than 2 bytes of data.

The ECC circuit 512 then arranges the sub-data units DB1-DB32 in an 8×4 two-dimensional (horizontal and vertical) data matrix and divides the sub-data units into a plurality of column data segments and a plurality of row data segments according to the dimensions. For instance, the sub-data units DB1-DB8 arranged in a horizontal manner are categorized as the row data segment RG1, the sub-data units DB9-DB16 are categorized as the row data segment RG2, the sub-data units DB17-DB24 are categorized as the row data segment RG3, and the sub-data units DB25-DB32 are categorized as the row data segment RG4. The sub-data units DB1, DB9, DB17, and DB25 arranged in a vertical manner are categorized as the column data segment CG1, the sub-data units DB2, DB10, DB18, and DB26 are categorized as the column data segment CG2, the sub-data units DB3, DB11, DB19, and DB27 are categorized as the column data segment CG3, the sub-data units DB4, DB12, DB20, and DB28 are categorized as the column data segment CG4, the sub-data units DB5, DB13, DB21, and DB29 are categorized as the column data segment CG5, the sub-data units DB6, DB14, DB22, and DB30 are categorized as the column data segment CG6, the sub-data units DB7, DB15, DB23, and DB31 are categorized as the column data segment CG7, and the sub-data units DB8, DB16, DB24, and DB32 are categorized as the column data segment CG8.

In the present exemplary embodiment, after dividing the sub-data units DB1-DB32 into the horizontal row data segments RG1-RG4 and the vertical column data segments CG1-CG8, the ECC circuit 512 applies the Bose-Chaudhuri-Hocquenghem (BCH) code algorithm as an auxiliary encoding algorithm to encode the sub-data units, so as to generate row and column error correcting codes corresponding to the row and column data segments. That is, as to the horizontal row data segments RG1-RG4, the ECC circuit 512 adopts the BCH code algorithm to encode the data in the row data segment RG1 (i.e., in the sub-data units DB1-DB8) and generate the row error correcting code BCH1 corresponding to the row data segment RG1. Similarly, the ECC circuit 512 generates the row error correcting code BCH2 corresponding to the row data segment RG2, the row error correcting code BCH3 corresponding to the row data segment RG3, and the row error correcting code BCH4 corresponding to the row data segment RG4. As to the vertical column data segments CG1-CG8, the ECC circuit 512 generates the column error correcting code BCH5 corresponding to the column data segment CG1, the column error correcting code BCH6 corresponding to the column data segment CG2, the column error correcting code BCH7 corresponding to the column data segment CG3, the column error correcting code BCH8 corresponding to the column data segment CG4, the column error correcting code BCH9 corresponding to the column data segment CG5, the column error correcting code BCH10 corresponding to the column data segment CG6, the column error correcting code BCH11 corresponding to the column data segment CG7, and the column error correcting code BCH12 corresponding to the column data segment CG8. Thereby, the data in the row data segments RG1-RG4 and the column data segments CG1-CG8 can be respectively protected by the corresponding row error correcting codes BCH1-BCH4 and the corresponding column error correcting codes BCH5-BCH12. Note that the sub-data units can be encoded by applying not only the BCH code algorithm as the auxiliary encoding algorithm but also other algorithms. For instance, in another embodiment, the ECC circuit 512 adopts an LDPC algorithm as the auxiliary encoding algorithm to encode the sub-data units.

It should be mentioned that the ECC circuit 512 divides the sub-data units into the column data segments and the row data segments and then encodes each of the column data segments and each of the row data segments, so as to generate the column error correcting codes corresponding the column data segments and generate the row error correcting codes corresponding to the row data segments. However, the present invention is not limited thereto. For instance, in another exemplary embodiment, the ECC circuit 512 may not divide the sub-data units into the column data segments and the row data segments; instead, the ECC circuit 512 directly perform is the error correction encoding operation on the sub-data units according to the arrangement of the sub-data units. For instance, the ECC circuit 512 performs the error correction encoding operation directly on the sub-data units DB1-DB8 to generate the row error correcting code BCH1 corresponding to the sub-data units DB1-DB8.

With reference to FIG. 8, the ECC circuit 512 combines the row error correcting codes BCH1-BCH4 and the column error correcting codes BCH5-BCH12 into the ECC code set ECC1 and stores the ECC code frame ECCF1 including the data stream UD1 (i.e., the sub-data units DB1-DB32) and the ECC code set ECC1 into the rewritable non-volatile memory module 406. After reading the data from the rewritable non-volatile memory module 406, the memory control circuit unit 404 performs the error correcting decoding operation on the data stream read from the ECC code frame ECCF1 by using the ECC code set ECC1 and thereby acquires the correct data stream UD1.

For instance, after receiving a reading command from the host system, the memory control circuit unit 404 (or the memory management circuit 502) reads the corresponding ECC code frame ECCF1 from the physical programming units of the rewritable non-volatile memory module 406 and acquires the uncorrected data stream UD1 and the corresponding ECC code set ECC1. The ECC circuit 512 then performs the error correction decoding operation to divide the uncorrected data stream into 32 sub-data units DB1-DB32, arranges the sub-data units DB1-DB32 in a two-dimensional data matrix 700, and acquires the column error correcting codes BCH5-BCH12 in each column data segment and the row error correcting codes BCH1-BCH4 in each row data segment from the ECC code set ECC1. The ECC circuit 512 decodes each column data segment by using the corresponding column error correcting code and decodes each row data segment by using the corresponding row error correcting code. The ECC circuit 512, for instance, firstly decodes the row data segments of the horizontally arranged sub-data units according to the row error correcting codes corresponding to the row data segments. That is, the ECC circuit 512 decodes the sub-data units DB1-DB8 according to the row error correcting code BCH1, decodes the sub-data units DB9-DB16 according to the row error correcting code BCH2, decodes the sub-data units DB17-DB24 according to the row error correcting code BCH3, and decodes the sub-data units DB25-DB32 according to the row error correcting code BCH4. If some of the sub-data units DB1-DB32 cannot be corrected after the error correction decoding operation is performed on the horizontally arranged sub-data units for the first time, the ECC circuit 512, according to the column error correcting codes corresponding to the column data segments, performs the error correction decoding operation for the first time on the vertically arranged column data segments including the uncorrectable sub-data units. For instance, the ECC circuit 512 decodes the sub-data units DB1, DB9, DB17, and DB25 through adopting the column error correcting code BCH5, decodes the sub-data units DB2, DB10, DB18, and DB26 through adopting the column error correcting code BCH6, decodes the sub-data units DB3, DB11, DB19, and DB27 through adopting the column error correcting code BCH7, decodes the sub-data units DB4, DB12, DB20, and DB28 through adopting the column error correcting code BCH8; decodes the sub-data units DB5, DB13 DB21, and DB29 through adopting the column error correcting code BCH9, decodes the sub-data units DB6, DB14, DB22 and DB30 through adopting the column error correcting code BCH10, decodes the sub-data units DB7, DB15, DB23, and DB31 through adopting the column error correcting code BCH11, or decodes the sub-data units DB8, DB16, DB24, and DB32 through adopting the column error correcting code BCH12. After the ECC circuit 512 performs the error correction decoding operation for the first time on the vertically arranged column data segments, the ECC circuit 512 performs the error correction decoding operation for the second time on the horizontally arranged row data segments and perform is the error correction decoding operation for the second time on the vertically arranged column data segments. Said operations are repetitively performed until all of the sub-data units are corrected or the condition of terminating the decoding operation is satisfied (e.g., the number of times of performing the decoding operation in an iterative manner exceeds a predetermined number of times). The sub-data units that cannot be corrected while the ECC circuit 512 performs the error correction decoding operation on the horizontally arranged row data segments may be corrected while the ECC circuit 512 performs the error correction decoding operation on the vertically arranged column data segments; hence, when the error correction decoding operation is again performed on the horizontally arranged row data segment, more sub-data units that cannot be corrected in the previous operation can now be corrected. Through the horizontal and vertical iterative decoding operations, the user data stream in the ECC code frame can be rapidly decoded, and the corrected data stream can be generated.

In the process of applying the BTC algorithm in an iterative manner, if the number of the error bits in one sub-data unit is greater than the maximum number of the error bits which can be corrected by the ECC circuit 512 (i.e., the maximum correctable number of error bits), the iterative BTC algorithm cannot be applied to correct the data in the sub-data unit. That is, although the number of error bits in the entire user data stream is not significant, the decoding operation may fail if all or most of the error bits are in one sub-data unit. Therefore, in the present exemplary embodiment, if the condition of terminating the decoding operation is satisfied (e.g., if the number of times of performing the decoding operation in an iterative manner exceeds a predetermined number of times), the ECC circuit 512 searches at least one uncorrectable sub-data unit from the decoded sub-data units in the decoded data stream and selects at least one target sub-data unit from the at least one uncorrectable sub-data unit. The ECC circuit 512 adjusts the value of the data stream in the at least one target sub-data unit and re-performs the error correction decoding operation on the adjusted column and row data segments through applying the BTC algorithm, so as to output the corrected data stream. Particularly, in the present exemplary embodiment, the ECC circuit 512 searches the uncorrectable sub-data unit according to the last decoded result and selects the target sub-data unit for further adjustment according to the column and row data segments that cannot be successfully decoded.

Figure 10:
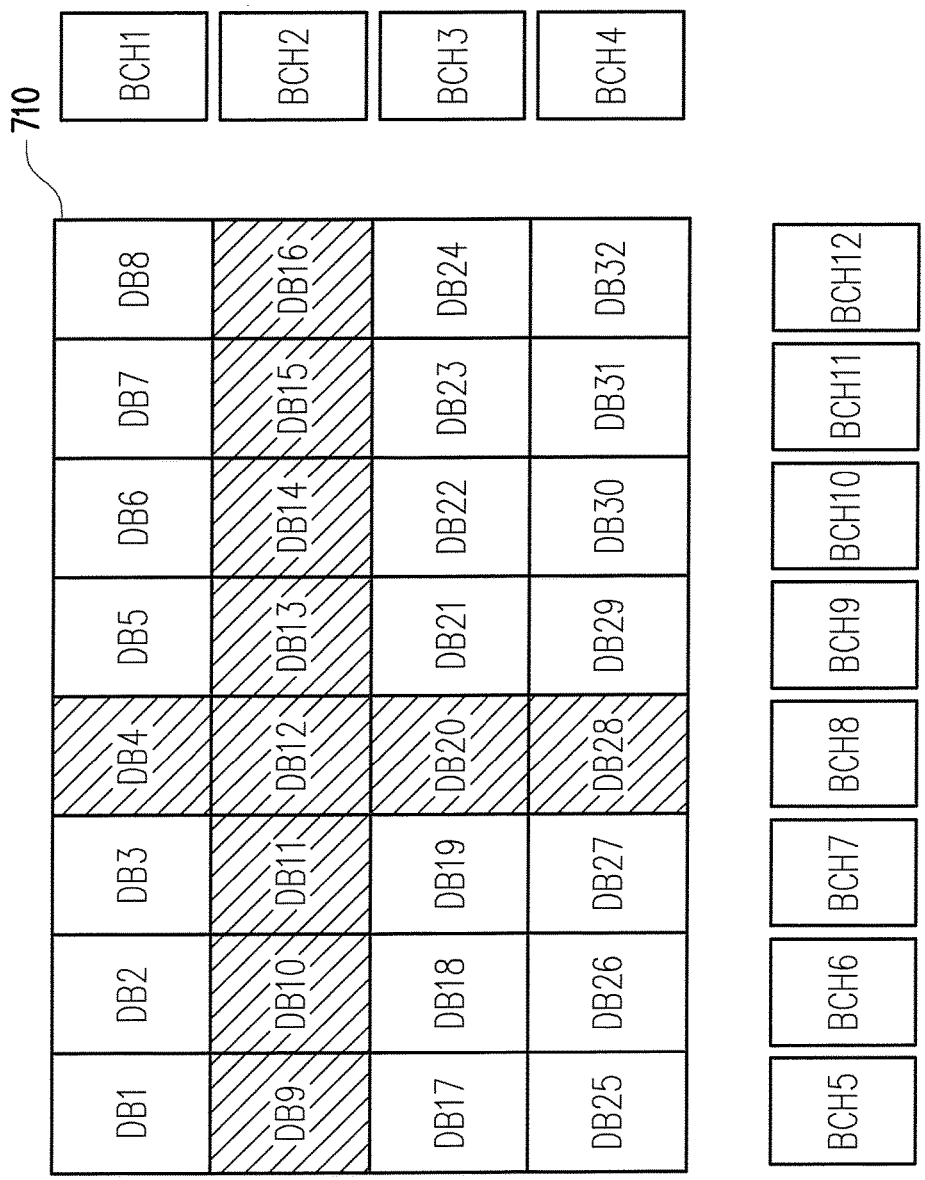
FIG. 10 is a schematic diagram of selecting a target sub-data unit according to an exemplary embodiment.

FIG. 10 is a schematic diagram of selecting a target sub-data unit according to an exemplary embodiment of the invention.

With reference to FIG. 10, it is assumed that the user data stream in the read ECC code frame ECCF1 is decoded through applying the BTC algorithm to output a decoded data stream (i.e., the first decoded data stream) which is arranged in a two-dimensional data matrix 710, and the ECC circuit 512 is neither able to correct the row data segment RG2 according to the row error correcting code BCH2 nor capable of correcting the column data segment CG4 according to the column error correcting code BCH8. In the present exemplary embodiment, the ECC circuit 512 searches the uncorrectable sub-data units DB4, DB9, DB10, DB11, DB12, DB13, DB14, DB15, DB16, DB20, and DB28 (as shown by the oblique lines). The ECC circuit 512 identifies the sub-data unit DB12 at the intersection of the uncorrectable row data segment RG2 and the uncorrectable column data segment CG4, and the sub-data unit DB12 serve as the target sub-data unit.

After the target sub-data unit is selected, the ECC circuit 512 changes the value of at least one bit of data in the target sub-data unit to generate the adjusted user data stream. For instance, if each sub-data unit includes two bytes of data, the ECC circuit 512 adjusts the value of one bit of data each time by changing "0" to "1" or changing "1" to "0". In an exemplary embodiment, the ECC circuit 512 may generate a corresponding adjusted data stream, and an XOR operation may be performed on the adjusted data stream and the data stream in the target sub-data unit for changing the bit value of the data. For instance, if the data stream in the target sub-data unit is "11111111", and the first bit is about to be changed to "0", the ECC circuit 512 may generate the adjusted data stream "10000000" and perform the XOR operation on the adjusted data stream "10000000" and the data stream "11111111" to obtain the data stream "01111111". After the value of data in the target sub-data unit is adjusted, the ECC circuit 512 combines the data stream in the target sub-data unit and the data streams in other sub-data units in the first decoded data stream as the adjusted user data stream and re-performs the BTC decoding operation to determine whether the target sub-data unit is correctable. If the target sub-data unit is still uncorrectable, the ECC circuit 512 repetitively adjusts the bit value in the target sub-data unit and re-performs the BTC decoding operation. That is, the first bit of data in the target sub-data unit is adjusted at first, the second bit of data in the target sub-data unit is then adjusted, the third bit of data in the target sub-data unit is adjusted thereafter, and the others can be derived from the above. In the process of re-performing the BTC decoding operation, if the target sub-data unit can be corrected and other uncorrectable sub-data units in the adjusted user data stream can all be corrected, the ECC circuit 512 outputs the corrected data stream.

Note that the ECC circuit 512 provided above changes the value of one bit of data at one time, which should however not be construed as a limitation to the present invention. In another embodiment, the ECC circuit 512 may change the values of two bits of data in the target sub-data unit every time.

In light of the foregoing, after the ECC circuit 512 provided herein completes the BTC decoding operation on the user stream and identifies the uncorrectable data stream, the ECC circuit 512 searches the sub-data unit that may contain significant error bits and adjusts the bit value in the sub-data unit by performing a bit flipping process, so as to further perform the decoding operation. As such, the ECC circuit 512 described in the present embodiment can enhance the data correction performance. Said process of searching the target sub-data unit, adjusting the bit value of data in the target sub-data unit, and re-performing the BTC decoding operation is called a "bit flipping decoding operation".

Figure 11:
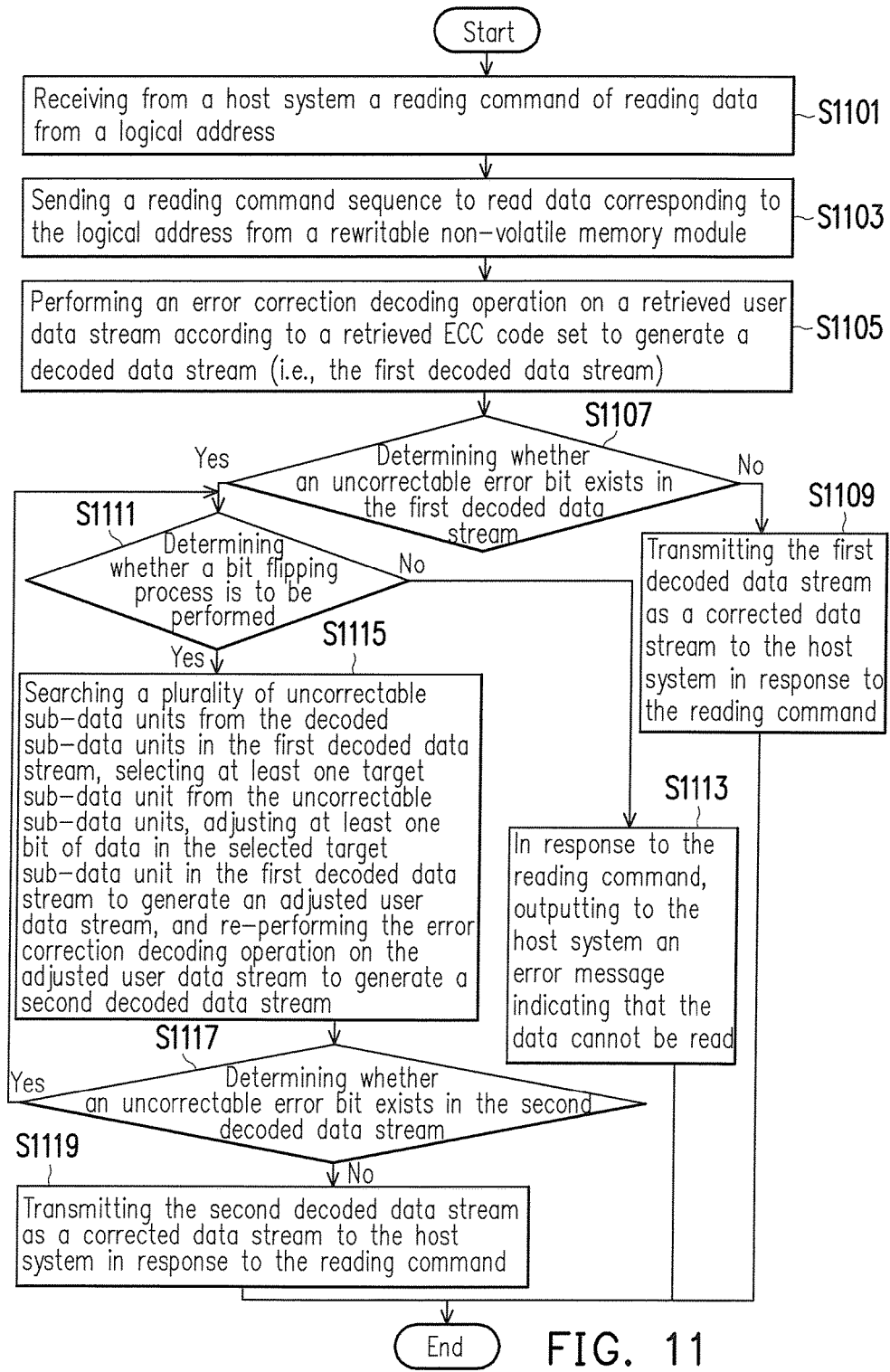
FIG. 11 is a flowchart illustrating a data reading method according to an exemplary embodiment.

FIG. 11 is a flowchart illustrating a data reading method according to an exemplary embodiment of the invention.

With reference to FIG. 11, in step S1101, the memory control circuit unit 404 (or the memory management circuit 502) receives from a host system 11 a reading command indicating reading data from a logical address.

In step S1103, the memory control circuit unit 404 (or the memory management circuit 502) sends a read command sequence to read data corresponding to the logical address from the rewritable non-volatile memory module 406.

In step S1105, the memory control circuit unit 404 (or the ECC circuit 512) performs an error correction decoding operation on the read user data stream according to the read ECC code set to generate a decoded data stream (i.e., the first decoded data stream). For instance, in the present embodiment, the memory control circuit unit 404 (or the ECC circuit 512) decodes the user data stream by applying the BTC algorithm; since the decoding process is elaborated above with reference to the drawings, no further explanation will be provided hereinafter.

In step S1107, the memory control circuit unit 404 (or the ECC circuit 512) determines whether an uncorrectable error bit exists in the first decoded data stream.

If the first decoded data stream does not contain any uncorrectable error bit, in step S1109, the memory control circuit unit 404 (or the memory management circuit 502) transmits the first decoded data stream as a corrected data stream to the host system 11 in response to the reading command.

If the first decoded data stream contains any uncorrectable error bit, in step S1111, the memory control circuit unit 404 (or the ECC circuit 512) determines whether a bit flipping process is to be performed. For instance, in an exemplary embodiment, the memory control circuit unit 404 (or the ECC circuit 512) determines whether the number of the uncorrectable column data segments and the number of the uncorrectable row data segments in the first decoded data stream are less than a predetermined value. The predetermine value is set to be 1, for instance. If the number of the uncorrectable column data segments or the number of the uncorrectable row data segments in the first decoded data stream is less than the predetermined value, the memory control circuit unit 404 (or the ECC circuit 512) determines to perform the bit flipping decoding operation. The memory control circuit unit 404 (or the ECC circuit 512) also determines whether the number of times of performing the bit flipping decoding operation reaches a threshold number of times of performing the bit flipping decoding operation; if yes, the memory control circuit unit 404 (or the ECC circuit 512) determines not to perform the bit flipping decoding operation.

If the bit flipping decoding operation is not performed, in step S1113, the memory control circuit unit 404 (or the memory management circuit 502) may, in response to the reading command, output to the host system 11 an error message indicating that the data cannot be read. It should be understood that the error message is sent to the host system 11 after the memory control circuit unit 404 (or the memory management circuit 502) determines not to perform the bit flipping decoding operation according to an exemplary embodiment of the invention. However, in another exemplary embodiment, the memory control circuit unit 404 may continue to decode the data through other auxiliary decoding mechanisms after the memory control circuit unit 404 determines not to perform the bit flipping decoding operation. For instance, the memory control circuit unit 404 generates external error correcting codes for a plurality of ECC code frames; if the user data stream in one of ECC code frames is uncorrectable, the memory control circuit unit 404 may read other ECC code frames and perform the error correcting operation on the ECC code frames through adopting the external error correcting codes, so as to correct the uncorrectable ECC code frame.

If it is determined that the bit flipping decoding operation is to be performed, in step S1115, the memory control circuit unit 404 (or the ECC circuit 512) searches a plurality of uncorrectable sub-data units from the decoded sub-data units in the first decoded data stream, selects at least one target sub-data unit from the uncorrectable sub-data units, adjusts at least one bit of data in the selected target sub-data unit in the first decoded data stream to generate an adjusted user data stream, and re-performs the error correction decoding operation on the adjusted user data stream to generate a second decoded data stream. In step S1115, the way to search the uncorrectable sub-data unit, select at least one target sub-data unit, and adjust at least one bit of data in the selected target sub-data unit is already described above and thus will not be further explained.

In step S1117, the memory control circuit unit 404 (or the ECC circuit 512) determines whether an uncorrectable error bit exists in the second decoded data stream. If the second decoded data stream does not contain any uncorrectable error bit, in step S1119, the memory control circuit unit 404 (or the memory management circuit 502) transmits the second decoded data stream as a corrected data stream to the host system 11 in response to the reading command. If the second decoded data stream contains the uncorrectable error bit, step S1111 is performed.

To sum up, according to the data reading method, the memory control circuit unit, and the memory storage apparatus provided herein, if the data read by the memory control circuit unit, and the memory storage apparatus cannot be corrected, the data can be correctly read after performing the bit flipping process on the sub-data unit having excessive error bits of data. As such, the data reading method, the memory control circuit unit, and the memory storage apparatus provided herein are conducive to better correction of error bits, and thereby data loss can be prevented.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A data reading method for a flash memory module of a flash memory storage apparatus, the data reading method comprising:
   receiving a read command from a host system;
   reading data from the flash memory module by a flash memory control circuit unit of the flash memory storage apparatus, wherein the data comprises a user data stream and an error checking and correcting code set, the user data stream comprises a plurality of sub-data units, the error checking and correcting code set comprises a plurality of column error correcting codes and a plurality of row error correcting codes, the column error correcting codes respectively correspond to a plurality of column data segments in the sub-data units, the row error correcting codes respectively correspond to a plurality of row data segments in the sub-data units, the column data segments are arranged in a matrix form, and the row data segments are arranged in a matrix form;
   performing an error correction decoding operation on the user data stream according to the error checking and correcting code set to generate a first decoded data stream by the flash memory control circuit unit, wherein the first decoded data stream comprises a plurality of decoded sub-data units corresponding to at least a part of the sub-data units;
   determining whether an error bit exists in the first decoded data stream;
   if the first decoded data stream has the error bit, searching at least one uncorrectable sub-data unit from the decoded sub-data units, selecting at least one target sub-data unit from the at least one uncorrectable sub-data unit, adjusting the first decoded data stream to an adjusted user data stream by adjusting the at least one target sub-data unit in the first decoded data stream, and re-performing the error correction decoding operation on the adjusted user data stream to generate a second decoded data stream by the flash memory control circuit unit; and
   if the second decoded data stream has no error bit, transmitting the second decoded data stream as a corrected data stream to the host system in response to the read command by the flash memory control circuit unit.

2. The data reading method according to claim 1,
   wherein the step of performing the error correction decoding operation on the user data stream according to the error checking and correcting code set to generate the first decoded data stream comprises decoding the column data segments and the row data segments according to the column error correcting codes and the row error correcting codes to acquire the decoded sub-data units.

3. The data reading method according to claim 2, further comprising:
   if the first decoded data stream has no error bit, transmitting the first decoded data stream as the corrected data stream to the host system; and
   if the first decoded data stream has the error bit, determining whether the number of uncorrectable column data segments of the column data segments or the number of uncorrectable row data segments of the row data segments are less than a predetermined value,
   wherein the step of searching the at least one uncorrectable sub-data unit from the decoded sub-data units, selecting the at least one target sub-data unit from the at least one uncorrectable sub-data unit, adjusting the first decoded data stream to the adjusted user data stream by adjusting the at least one target sub-data unit in the first decoded data stream, and re-performing the error correction decoding operation on the adjusted user data stream to generate the second decoded data stream is performed only when the number of the uncorrectable column data segments is less than the predetermined value or the number of the uncorrectable row data segments is less than the predetermined value.

4. The data reading method according to claim 3, further comprising:
   if neither the number of the uncorrectable column data segments nor the number of the uncorrectable row data segments is less than the predetermined value, transmitting an error message to the host system.

5. The data reading method according to claim 3, wherein the step of selecting the at least one target sub-data unit from the at least one uncorrectable sub-data unit comprises:
   serving a first uncorrectable sub-data unit of the at least one uncorrectable sub-data unit as the at least one target sub-data unit according to one of the uncorrectable column data segments and one of the uncorrectable row data segments,
   wherein the first uncorrectable sub-data unit is included in a first column data segment among the column data segments and included in a first row data segment among the row data segments, a first column error correcting code corresponding to the first column data segment among the column error correcting codes is unable to correct the first column data segment, and a first row error correcting code corresponding to the first row data segment among the row error correcting codes is unable to correct the first row data segment.

6. The data reading method according to claim 5, wherein the step of adjusting the at least one target sub-data unit in the first decoded data stream to generate the adjusted user data stream comprises:
   performing a logical operation on the first uncorrectable sub-data unit with an adjusted data stream to adjust at least one hit of data in the first uncorrectable sub-data unit.

7. A flash memory control circuit unit disposed in a flash memory storage apparatus and controlling a flash memory module of the flash memory storage apparatus, the flash memory control circuit unit comprising:
   a host interface configured to couple to a host system; and
   a memory interface configured to couple to the flash memory module;
   a memory management circuit coupled to the host interface and the memory interface; and
   an error checking and correcting circuit coupled to the memory management circuit,
   wherein the host interface is configured to receiving a read command from the host system,
   wherein the memory management circuit is configured to send a read command sequence to read data from the flash memory module, the data comprises a user data stream and an error checking and correcting code set, the user data stream comprises a plurality of sub-data units, the error checking and correcting code set comprises a plurality of column error correcting codes and a plurality of row error correcting codes, the column error correcting codes respectively correspond to a plurality of column data segments in the sub-data units arranged in a matrix form, and the row error correcting codes respectively correspond to a plurality of row data segments in the sub-data units arranged in a matrix form;

wherein the error checking and correcting circuit is configured to perform an error correction decoding operation on the user data stream according to the error checking and correcting code set to generate a first decoded data stream, wherein the first decoded data stream comprises a plurality of decoded sub-data units corresponding to at least a part of the sub-data units;

wherein the error checking and correcting circuit is further configured to determine whether an error bit exists in the first decoded data stream;

wherein if the first decoded data stream has the error bit, the error checking and correcting circuit is further configured to search at least one uncorrectable sub-data unit from the decoded sub-data units, select at least one target sub-data unit from the at least one uncorrectable sub-data unit, adjust the first decoded data stream to an adjusted user data stream by adjusting the at least one target sub-data unit in the first decoded data stream, and re-perform the error correction decoding operation on the adjusted user data stream to generate a second decoded data stream, wherein if the second decoded data stream has no error bit, the memory management circuit is further configured to transmit the second decoded data stream as a corrected data stream to the host system in response to the read command.

8. The flash memory control circuit unit according to claim 7, wherein when the error correction decoding operation is performed on the user data stream according to the error checking and correcting code set to generate the first decoded data stream, the error checking and correcting circuit is further configured to decode the column data segments and the row data segments by applying a block turbo code algorithm according to the column error correcting codes and the row error correcting codes to acquire the decoded sub-data units.

9. The flash memory control circuit unit according to claim 8, wherein if the first decoded data stream has no error bit, the memory management circuit is further configured to transmit the first decoded data stream as the corrected data stream to the host system, wherein if the first decoded data stream has the error bit, the error checking and correcting circuit is further configured to determine whether the number of uncorrectable column data segments of the column data segments or the number of uncorrectable row data segments of the row data segments are less than a predetermined value, wherein only when the number of the uncorrectable column data segments is less than the predetermined value or the number of the uncorrectable row data segments is less than the predetermined value, the error checking and correcting circuit searches the at least one uncorrectable sub-data unit from the decoded sub-data units, selects the at least one target sub-data unit from the at least one uncorrectable sub-data unit, adjusts the first decoded data stream to the adjusted user data stream by adjusting the at least one target sub-data unit in the first decoded data stream, and re-performs the error correction decoding operation on the adjusted user data stream to generate the second decoded data stream.

10. The flash memory control circuit unit according to claim 9, wherein if neither the number of the uncorrectable column data segments nor the number of the uncorrectable row data segments is less than the predetermined value, the memory management circuit is further configured to transmit an error message to the host system.

11. The flash memory control circuit unit according to claim 9, wherein when the at least one target sub-data unit is selected from the at least one uncorrectable sub-data unit, the error checking and correcting circuit is further configured to serve a first uncorrectable sub-data unit of the at least one uncorrectable sub-data unit as the at least one target sub-data unit according to one of the uncorrectable column data segments and one of the uncorrectable row data segments, wherein the first uncorrectable sub-data unit is included in a first column data segment among the column data segments and included in a first row data segment among the row data segments, a first column error correcting code corresponding to the first column data segment among the column error correcting codes is unable to correct the first column data segment, and a first row error correcting code corresponding to the first row data segment among the row error correcting codes is unable to correct the first row data segment.

12. The flash memory control circuit unit according to claim 11, wherein in the operation of adjusting the at least one target sub-data unit in the first decoded data stream, the error checking and correcting circuit is further configured to perform a logical operation on the first uncorrectable sub-data unit with an adjusted data stream to adjust at least one bit of data in the first uncorrectable sub-data unit.

13. A flash memory storage apparatus comprising:
a connection interface unit configured to couple to a host system;
a flash memory module; and
a flash memory control circuit unit coupled to the connection interface unit and the flash memory module,
wherein the flash memory control circuit unit is configured to receive a read command from the host system,
wherein the flash memory control circuit unit is further configured to send a read command sequence to read data from the flash memory module, the data comprises a user data stream and an error checking and correcting code set, the user data stream comprises a plurality of sub-data units, the error checking and correcting code set comprises a plurality of column error correcting codes and a plurality of row error correcting codes, the column error correcting codes respectively correspond to a plurality of column data segments in the sub-data units arranged in a matrix form, and the row error correcting codes respectively correspond to a plurality of row data segments in the sub-data units arranged in a matrix form;

wherein the flash memory control circuit unit is further configured to perform an error correction decoding operation on the user data stream according to the error checking and correcting code set to generate a first decoded data stream, wherein the first decoded data stream comprises a plurality of decoded sub-data units corresponding to at least a part of the sub-data units;

wherein the flash memory control circuit unit is further configured to determine whether an error bit exists in the first decoded data stream;

wherein if the first decoded data stream has the error bit, the flash memory control circuit unit is further configured to search at least one uncorrectable sub-data unit from the decoded sub-data units, select at least one target sub-data unit from the at least one uncorrectable sub-data unit, adjust the first decoded data stream to an adjusted user data stream by adjusting the at least one target sub-data unit in the first decoded data stream, and re-perform the error correction decoding operation on the adjusted user data stream to generate a second decoded data stream, wherein if the second decoded data stream has no error bit, the flash memory control circuit unit is further configured to transmit the second decoded data stream as a corrected data stream to the host system in response to the read command.

14. The flash memory storage apparatus according to claim 13, wherein when the error correction decoding operation is performed on the user data stream according to the error checking and correcting code to generate the first decoded data stream, the flash memory control circuit unit is further configured to decode the column data segments and the row data segments by applying a block turbo code algorithm according to the column error correcting codes and the row error correcting codes to acquire the decoded sub-data units.

15. The flash memory storage apparatus according to claim 14, wherein if the first decoded data stream has no error bit, the flash memory control circuit unit is further configured to transmit the first decoded data stream as the corrected data stream to the host system, wherein if the first decoded data stream has the error bit, the flash memory control circuit unit is further configured to determine whether the number of uncorrectable column data segments of the column data segments and the number of uncorrectable row data segments of the row data segments are less than a predetermined value, wherein only when the number of the uncorrectable column data segments is less than the predetermined value or the number of the uncorrectable row data segments is less than the predetermined value, the flash memory control circuit unit searches the at least one uncorrectable sub-data unit from the decoded sub-data units, selects the at least one target sub-data unit from the at least one uncorrectable sub-data unit, adjusts the first decoded data stream to the adjusted user data stream by adjusting the at least one target sub-data unit in the first decoded data stream, and re-performs the error correction decoding operation on the adjusted user data stream to generate the second decoded data stream.

16. The flash memory storage apparatus according to claim 15, wherein if neither the number of the uncorrectable column data segments nor the number of the uncorrectable row data segments is less than the predetermined value, the flash memory control circuit unit is further configured to transmit an error message to the host system.

17. The flash memory storage apparatus according to claim 15, wherein when the at least one target sub-data unit is selected from the at least one uncorrectable sub-data unit, the flash memory control circuit unit is further configured to serve a first uncorrectable sub-data unit of the at least one uncorrectable sub-data unit as the at least one target sub-data unit according to one of the uncorrectable column data segments and one of the uncorrectable row data segments, wherein the first uncorrectable sub-data unit is included in a first column data segment among the column data segments and included in a first row data segment among the row data segments, a first column error correcting code corresponding to the first column data segment among the column error correcting codes is unable to correct the first column data segment, and a first row error correcting code corresponding to the first row data segment among the row error correcting codes is unable to correct the first row data segment.

18. The flash memory storage apparatus according to claim 17, wherein in the operation of adjusting the at least one target sub-data unit in the first decoded data stream, the flash memory control circuit unit is further configured to perform a logical operation on the first uncorrectable sub-data unit with an adjusted data stream to adjust at least one bit of data in the first uncorrectable sub-data unit.

* * * * *